(12) United States Patent
Yu et al.

(10) Patent No.: US 11,122,674 B1
(45) Date of Patent: Sep. 14, 2021

(54) PCB WITH COIN AND DIELECTRIC LAYER

(71) Applicant: Multek Technologies Limited, Irvine, CA (US)

(72) Inventors: Pui Yin Yu, Hong Kong (CN); Xin Hua Zeng, Zhuhai (CN); Jian Ying Xue, Zhuhai (CN); Hong Tu Zhang, Zhuhai (CN)

(*) Notice: Subject to any disclaimer, the term of this patent is extended or adjusted under 35 U.S.C. 154(b) by 0 days.

(21) Appl. No.: 16/946,711

(22) Filed: Jul. 1, 2020

(30) Foreign Application Priority Data

May 15, 2020 (CN) .......................... 202010412585.3

(51) Int. Cl.
*H05K 1/02* (2006.01)
*H05K 3/00* (2006.01)
*H05K 3/24* (2006.01)

(52) U.S. Cl.
CPC ........... *H05K 1/0204* (2013.01); *H05K 1/021* (2013.01); *H05K 3/0061* (2013.01); *H05K 3/244* (2013.01); *H05K 2201/0338* (2013.01)

(58) Field of Classification Search
CPC ....... H05K 1/0201–021; H05K 3/0061; H05K 7/205; H05K 2201/066; H05K 2201/10416
See application file for complete search history.

(56) References Cited

U.S. PATENT DOCUMENTS

2014/0168899 A1* 6/2014 Chang .................. H05K 1/0204
361/709

* cited by examiner

*Primary Examiner* — Jeremy C Norris
(74) *Attorney, Agent, or Firm* — Carlson, Caspers, Vandenburgh & Lindquist, P.A.

(57) ABSTRACT

A printed circuit board includes a first, second, and third conductive layer. The printed circuit boards also includes a first non-conductive layer between the first and second conductive layers and a second non-conductive layer between the second and third conductive layers. The printed circuit board further includes a dielectric layer between the second conductive layer and the second non-conductive layer and a coin for heat dispersion located underneath the dielectric layer. The printed circuit board also includes a cavity for receiving a component and a plating within the cavity to connect the coin with the second conductive layer. The plating extends less than 50 um above the second conductive layer.

20 Claims, 9 Drawing Sheets

PCB WITH COIN AND DIELECTRIC LAYER

RELATED APPLICATIONS

This application claims the benefit of Chinese Patent Application No. 202010412585.3 filed on May 15, 2020, entitled "PCB WITH COIN AND DIELECTRIC LAYER", which is hereby incorporated herein by reference.

FIELD OF THE DISCLOSURE

The present application relates generally to printed circuit boards, and more particularly to a low stub cavity process and structure.

BACKGROUND

A printed circuit board (PCB) mechanically supports and electrically connects electronic components using conductive traces, pads and other features etched from electrically conductive sheets, such as copper sheets, laminated onto a non-conductive substrate. Multi-layered printed circuit boards are formed by stacking and laminating multiple such etched conductive sheet/non-conductive substrate. Conductors on different layers are interconnected with plated-through holes called vias.

A PCB includes a plurality of stacked layers, the layers are made of alternating non-conductive layers and conductive layers. The non-conductive layers can be made of prepreg or base material, that is part of a core structure, or simply core. Prepreg is a fibrous reinforcement material impregnated or coated with a resin binder and consolidated and partially cured to an intermediate stage semi-solid product. Prepreg is used as an adhesive layer to bond discrete layers of multiplayer PCB construction, where a multilayer PCB consists of alternative layers of conductors and base materials bonded together, including at least one internal conductive layer. A base material is a fully cured organic or inorganic material used to support a pattern of conductor material. A core is a metal clad base material where the base material has integral metal conductor material on one or both sides. A laminated stack is formed by stacking multiple core structures with intervening prepreg and then laminating the stack to fully cure the prepreg and bond the adjacent layers together. A via is then formed by drilling a hole through the laminated stack and plating the wall of the hole with electrically conductive material, such as copper. The resulting plating interconnects the conductive layers in the laminated stack.

To dissipate heat, coins can be used. A copper coin has a high thermal conductivity and heat, generated from components on the PCB, is transferred to the copper coin quickly and dispersed into the air. The copper coin is embedded into the PCB in the lamination step. To reduce board thickness after component assembly, a cavity is routed on top of copper coin and the coin has to be connected to an inner layer of copper for grounding. The general process includes plating the cavity wall after cavity formation by routing, which results in a stub. The resulting stub is inefficient for signal transfer as signals needs to jump over the stub to the ground layer, which leads to losses. Therefore, improvements are desirable.

SUMMARY

In a first aspect of the present invention, a printed circuit board includes a first, second, and third conductive layer. The printed circuit boards also includes a first non-conductive layer between the first and second conductive layers and a second non-conductive layer between the second and third conductive layers. The printed circuit board further includes a dielectric layer between the second conductive layer and the second non-conductive layer and a coin for heat dispersion located underneath the dielectric layer. The printed circuit board also includes a cavity for receiving a component and a plating within the cavity to connect the coin with the second conductive layer. The plating extends less than 50 um above the second conductive layer.

In a second aspect of the present invention, a method of manufacturing a printed circuit board includes laminating a multi-stack printed circuit board having first, second and third conductive layers, a first non-conductive layer between the first and second conductive layers, a second non-conductive layer between the second and third conductive layers, a dielectric layer between the second conductive layer and the second non-conductive layer, a coin underneath the dielectric layer; routing a cavity for receiving a component; and plating the cavity to connect the coin and the second conductive layer, wherein the plating extends less than 50 um above the second conductive layer.

The foregoing has outlined rather broadly the features and technical advantages of the present invention in order that the detailed description of the invention that follows may be better understood. Additional features and advantages of the invention will be described hereinafter that form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features that are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE FIGURES

For a more complete understanding of the disclosed system and methods, reference is now made to the following descriptions taken in conjunction with the accompanying drawings.

DETAILED DESCRIPTION

Embodiments of the present application are directed to a printed circuit board. Those of ordinary skill in the art will recognize that the following detailed description of the printed circuit hoard is illustrative only and is not intended to be in any way limiting. Other embodiments of the printed circuit board will readily suggest themselves to such skilled persons having the benefit of this disclosure.

Figure 1:
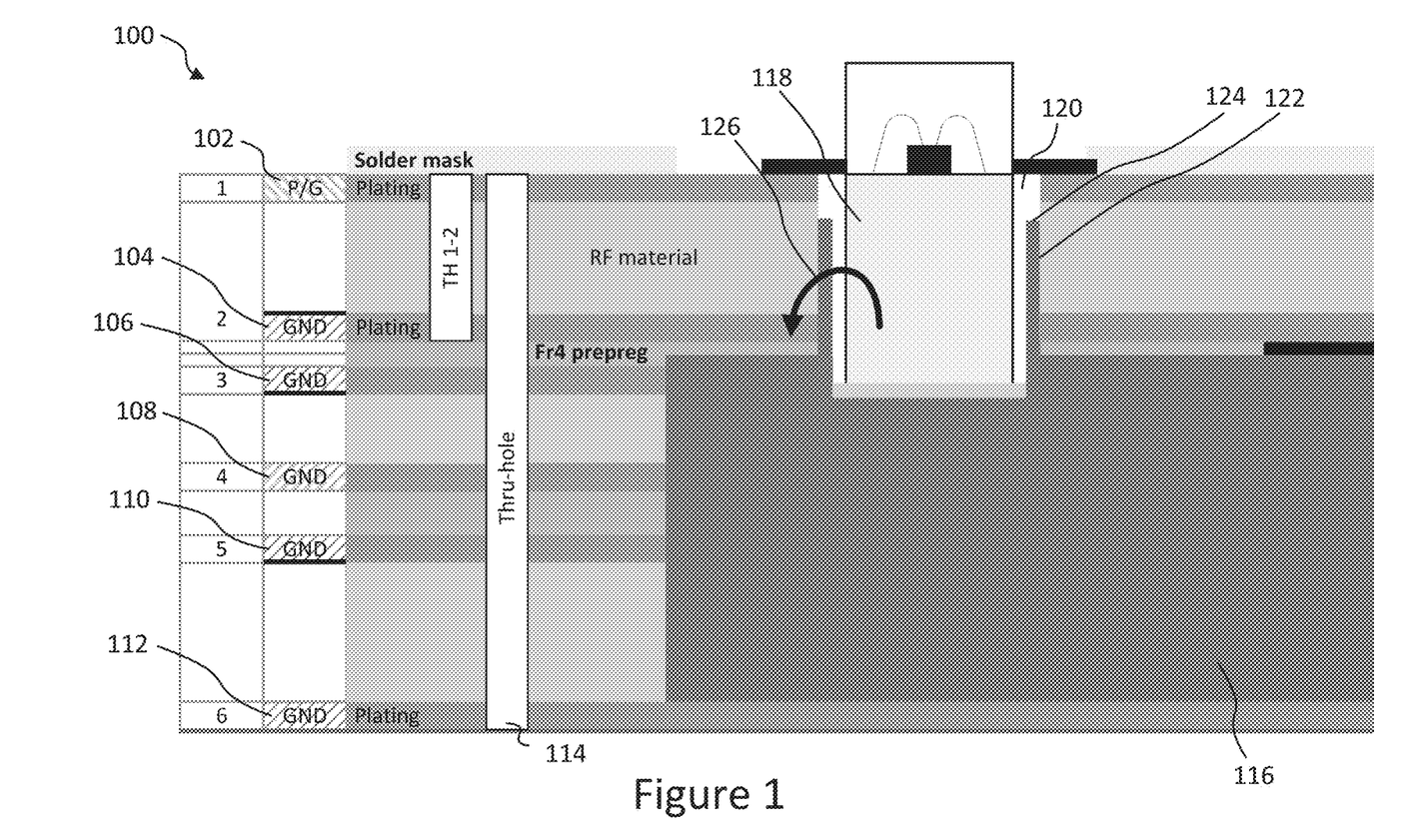
FIG. 1 is a cross-sectional view of a printed circuit board.

Referring to FIG. 1, a cross section of a typical multi-layer PCB 100 is shown. The PCB 100 is a laminated stack having a plurality of conductive layers 102, 104, 106, 108, 110, 112, typically comprising copper. Each conductive layer 102, 104, 106, 108, 110 is patterned to form electrically conductive interconnects. Each conductive layer 102, 104, 106, 108, 110, 112 is separated by an insulating, or non-conductive layer. It is noted that the number of non-conductive layers and conductive layers shown in FIG. 1 is merely a design choice and that fewer or greater numbers of non-conductive layers and conductive layers can be used.

Each non-conductive layer is made of a non-conductive material, such as prepreg or base material. Prepreg is a fibrous reinforcement material impregnated or coated with a resin binder, and consolidated and partially cured to an intermediate stage semi-solid product. The prepreg can be a regular flow prepreg, which enables a regular pressure to be used during a subsequent lamination step. A low flow prepreg is used to describe a prepreg with lower resin flow than normal. Typically, low flow prepreg has resin flow less than 100 mil while regular flow is greater than 100 mil. Prepreg is used as an adhesive layer to bond discrete layers of a multilayer PCB construction. Base material and prepreg each include resin and glass cloth, but the resin in base material is already fully cured and as such does not flow during lamination. The resin in prepreg is only partially cured and therefore flows during lamination. A core is a metal clad base material where the base material has integral metal conductor material on one or both sides. A laminated stack is formed by stacking multiple core structures with intervening prepreg and then laminating the stack.

The PCB 100 also has a through-hole 114, or via, which electrically interconnects one or more conductive layers. The via 114 is typically drilled through the laminated stack. After drilling, a desmear process can be used to remove residue, such as residue particles from the drilling of the via 114. Next, an electroless plating process is performed to form a plating on the side walls of the via 114. A flash copper plating process is then used. The plating interconnects various conductive layers in the stack.

The PCB 100 also includes a coin 116, typically comprising copper, which has a high thermal conductivity. A component 118 is attached to the PCB 100 above the coin 116, so that the coin 116 can serve as a heat sink for the component 118. During manufacturing of the PCB 100, a cavity 120 is drilled, milled or routed in the PCB 100 above the coin 116 to accommodate the component 118. In one example, a routing tool having a rout bit is used to form a cavity 120 into the laminated stack to a certain depth. Alternatively, a mechanical plus laser depth controlled routing process is used.

Because the coin 116 needs to be grounded, the cavity 120 then has to be plated 122 by a two-step process similar to that for the via 114. The first step is to use electroless copper around the edges of the cavity. The second step is to use copper plating over the electroless copper to form a thicker copper. The cavity 120 then has to be routed again to remove the copper plating from connecting to the first layer 102, leaving a stub 124. This stub 124 interferes with signal transfer as a signal 126 from the electronic component 118 needs to jump over the stub 124 to reach the ground layer 104. This process of routing twice leaves a relatively large variation in the dimensions of the cavity 120 and the depth of the cavity 120 along with a large variation in the stub length, making it difficult to design around the signal loss or to reduce the stub length.

Figure 2:
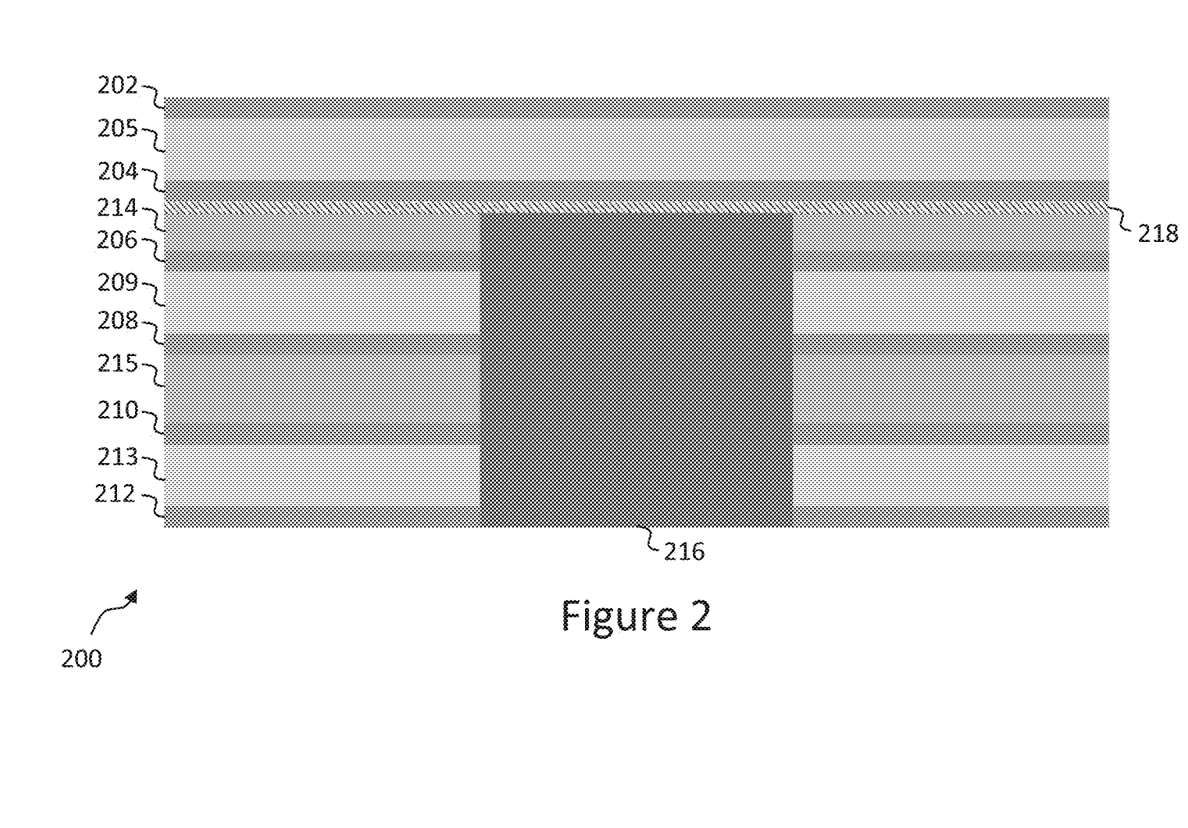
FIG. 2 is a cross-sectional view a printed circuit board during manufacturing, according to one embodiment of the present invention.

Referring to FIG. 2, a cross section of a multi-layer PCB 200, according to one example of the present invention, is shown. The PCB 200 is a laminated stack having six conductive layers 202, 204, 206, 208, 210, 212 and a coin 216 similar to the PCB 100 of FIG. 1. Each conductive layer 202, 204, 206, 208, 210, 212 can be copper and is patterned to form electrically conductive interconnects. Between each conductive layer 202, 204, 206, 208, 210, 212 is one or more non-conductive layers and/or one or more multilayer laminate cores. Multilayer laminate cores can comprise thinner alternating conductive and non-conductive layers.

The PCB 200 is in a post lamination state. That is, resins in the non-conductive layers are fully cured and the conductive layers 202, 204, 206, 208, 210, 212 and non-conductive layers 205, 209, 213 are bonded together by non-conductive layers 214, 215. The laminated stack is formed by stacking multiple conductive layers and optionally core structures with intervening prepreg and then laminating the stack to fully cure the prepreg and bond the adjacent layers together. It is noted that the number of non-conductive layers and conductive layers shown in FIG. 2 is merely a design choice and that fewer or greater numbers of non-conductive layers and conductive layers can be used.

The PCB 200 includes a thin dielectric layer 218 below the ground layer 204.

Preferably, the thin dielectric layer 218 is between 1-40 um. A dielectric material is an electrical insulator that can be polarized by an applied electric field. When a dielectric material is placed in an electric field, electric charges do not flow through the material as they do in an electrical conductor but only slightly shift from their average equilibrium positions causing dielectric polarization. Because of dielectric polarization, positive charges are displaced in the direction of the field and negative charges shift in the direction opposite to the field. This creates an internal electric field that reduces the overall field within the dielectric itself.

For example, in FIG. 2, during manufacture, the first and second conductive layers 202, 204, separated by the non-conductive layer 205, would be a first premade board. The thin dielectric layer 218 would be added to this first board. A second board would include the third conductive layer 206 and fourth conductive layer 208, separated by the non-conductive layer 209. A third board would include the fifth conductive layer 210 and a sixth conductive layer 212, separated by the non-conductive layer 213. During manufacture, the three separate boards would be bonded together by non-conductive layers 214, 215, or prepreg. The whole first board can be added right on top of the coin and still bonded by the prepreg layer 214, which would flow around the coin 216.

Figure 3:
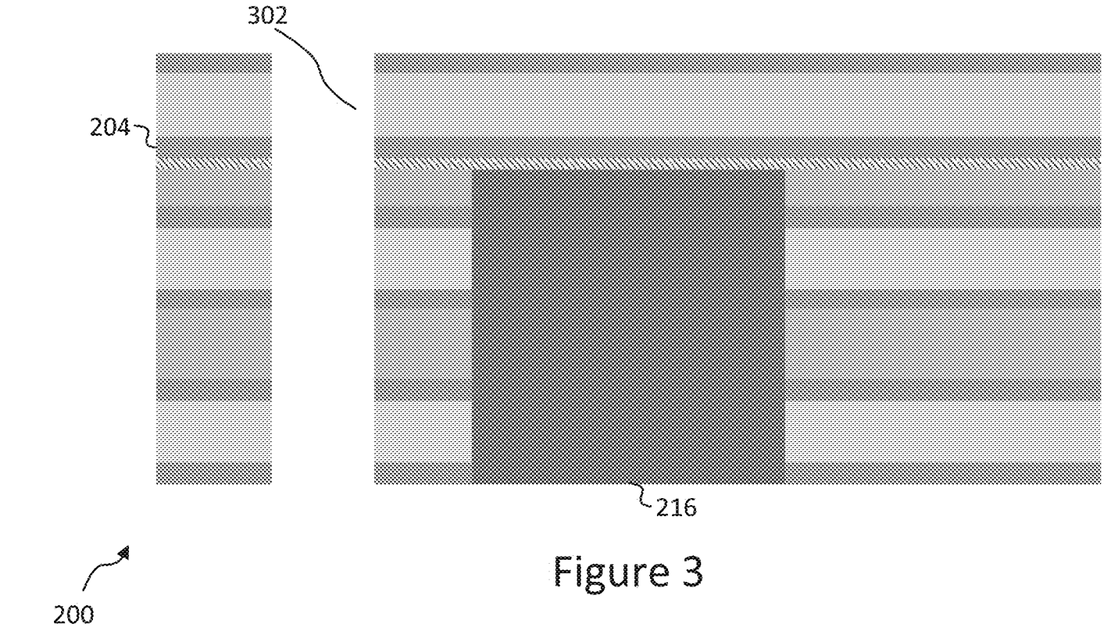
FIG. 3 is a cross-sectional view the printed circuit board during manufacturing, according to one embodiment of the present invention.
Figure 4:
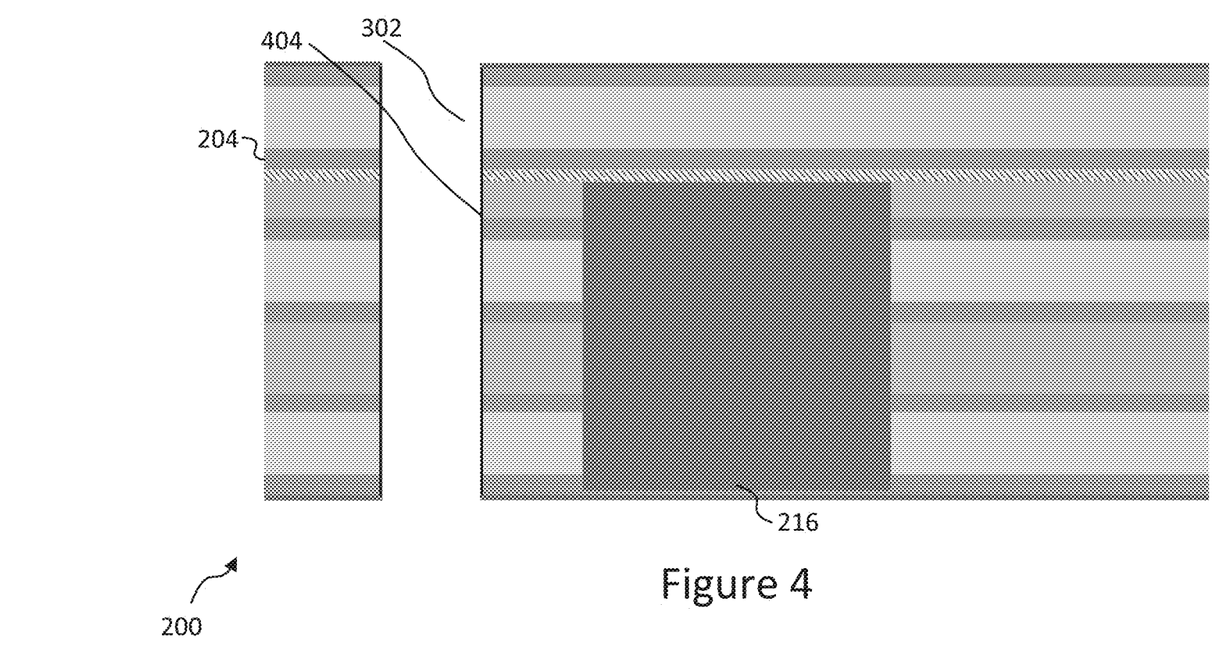
FIG. 4 is a cross-sectional view the printed circuit board during manufacturing, according to one embodiment of the present invention.
Figure 5:
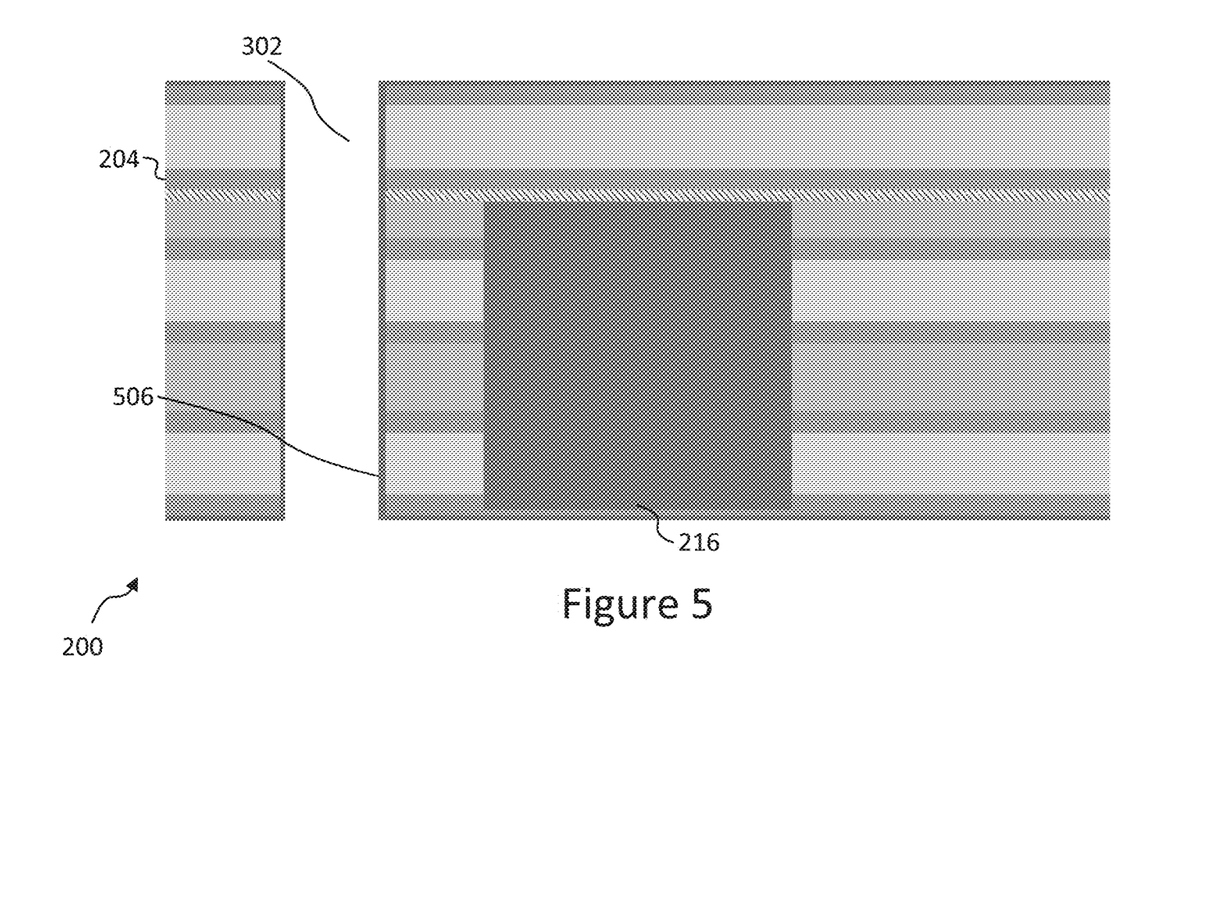
FIG. 5 is a cross-sectional view the printed circuit board during manufacturing, according to one embodiment of the present invention.

Referring to FIG. 3, a via 302 is drilled through the PCB 200. In FIG. 4, electroless copper 404 is added around the circumference of the via 302. In FIG. 5, copper plating 506 is added electrolytically to the electroless copper 404.

Figure 6:
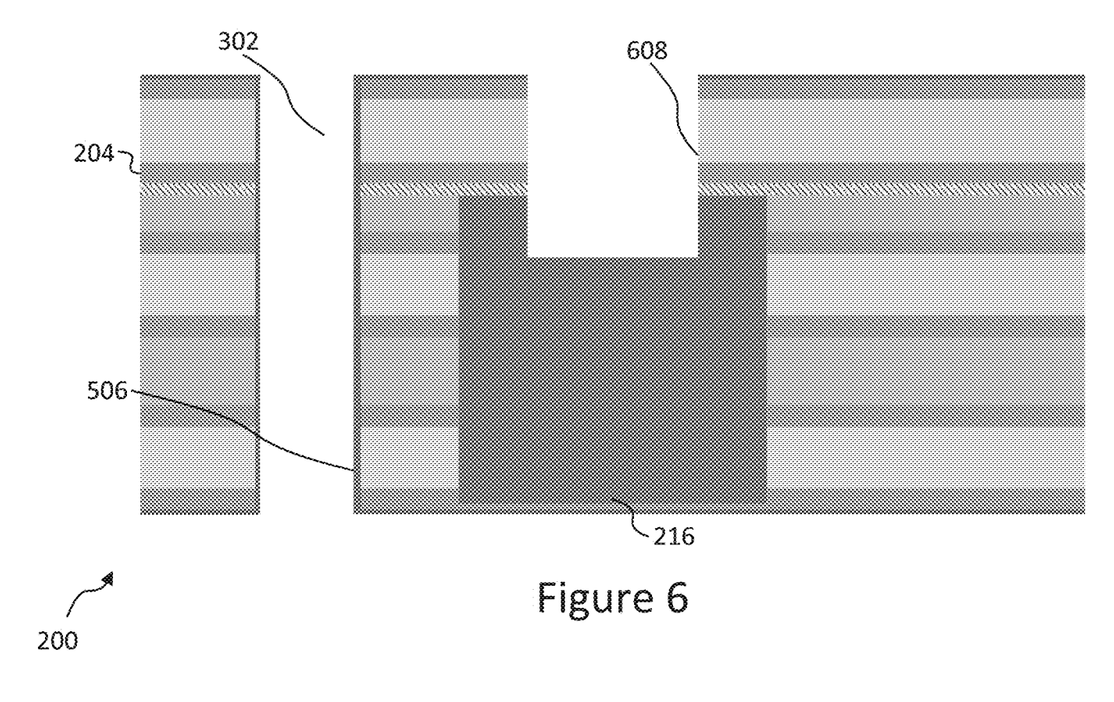
FIG. 6 is a cross-sectional view the printed circuit board during manufacturing, according to one embodiment of the present invention.
Figure 7:
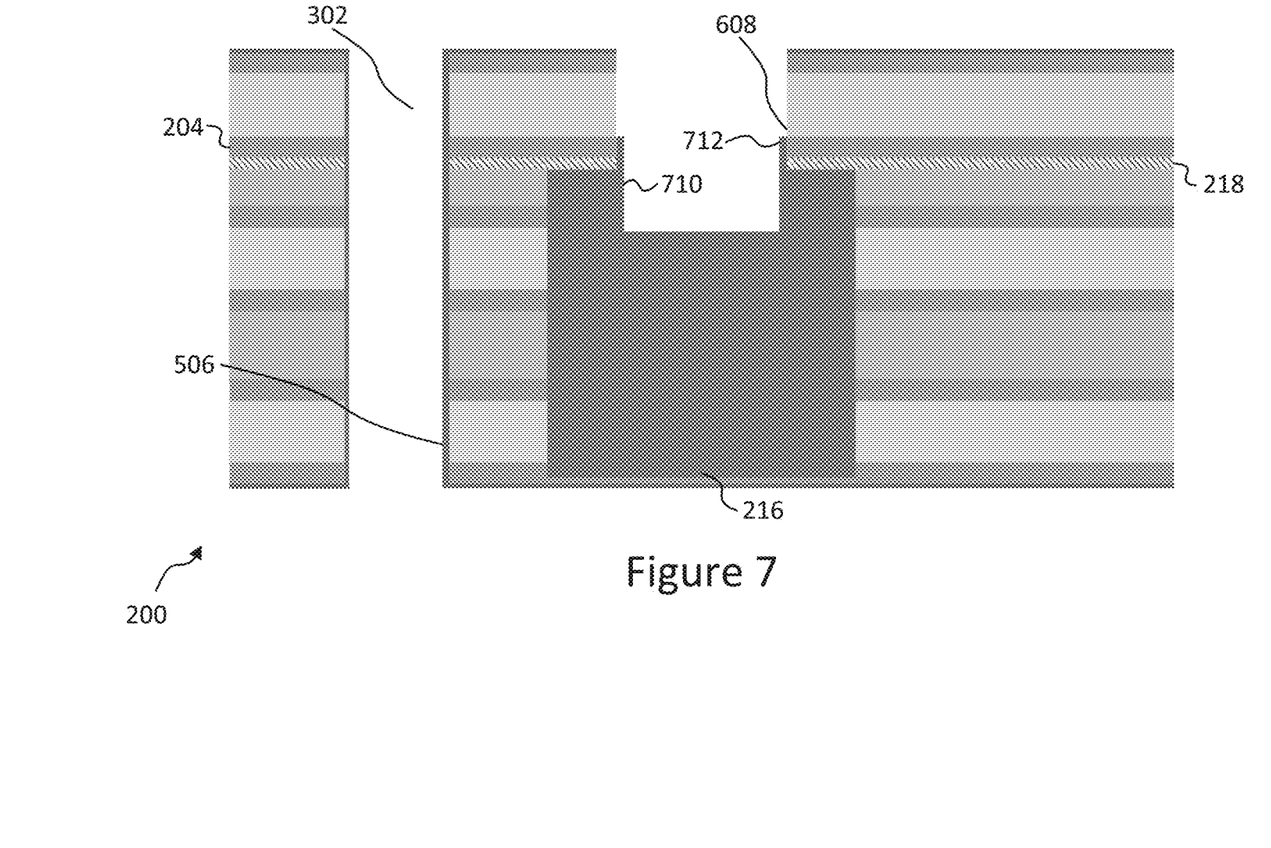
FIG. 7 is a cross-sectional view the printed circuit board during manufacturing, according to one embodiment of the present invention.

Referring to FIG. 6, a cavity 608 is routed to accommodate a component. Referring to FIG. 7, copper plating 710 is added electrolytically to the cavity 608 to connect the coin 216 and the second layer 204. The thin dielectric layer 218 eliminates the need for electroless copper plating to electrically couple the ground layer 204 and the coin 216. This is because the thin dielectric layer 218 enables electrolytically added copper plating to grow directly across it—that is, without electroless copper plating—from the coin 216 to the ground layer 204. The electroplating process is therefore able to merge together to electrically couple the ground layer 204 and the coin 216 without a foundational electroless plating step. Because of the lack of a electroless plating step, the stub 712 can be controlled to 0-50 um with small variation in the opening of the cavity 608. Although this example shows the dielectric layer 218 disposed between the second conductive layer 204 (L2) and the copper coin 216, in other examples the dielectric layer 218 can be disposed between a different conductive layer (e.g., L3) and the copper coin 216 with the cavity depth and other steps adjusted accordingly to enable the copper coin 216 to be coupled across the dielectric layer 218 to that conductive layer as described herein.

Figure 8:
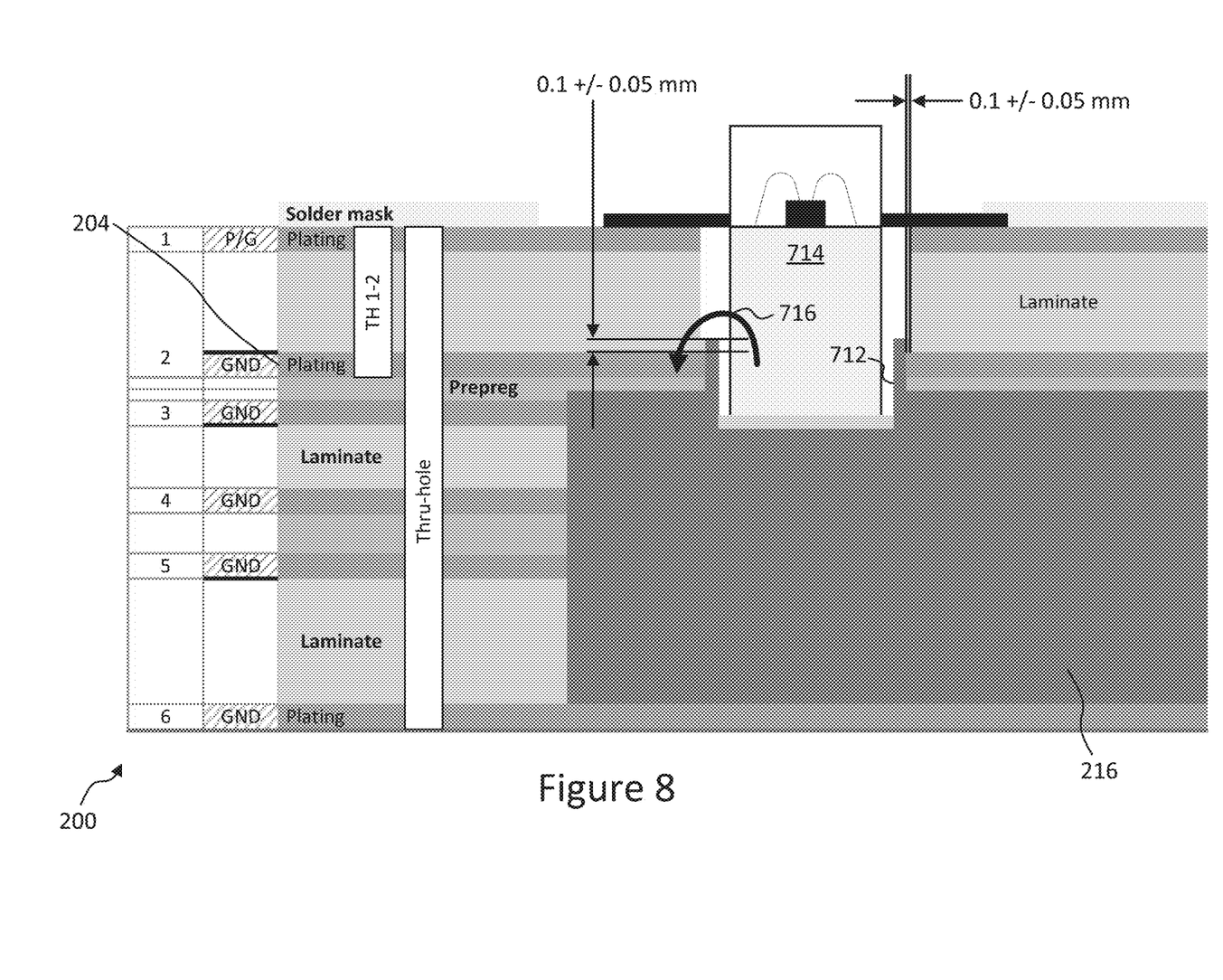
FIG. 8 is a cross-sectional view a printed circuit board manufactured according to FIGS. 2-7, according to one embodiment of the present invention.

Referring to FIG. 8, FIG. 8 illustrates the finished cross sectional view of the PCB 200 manufactured according to FIGS. 2-7. As illustrated the stub 712 is shorter than the stub 124 of FIG. 1. This smaller stub 712, is advantageous in reducing signal loss 716 from the component 714 to the ground layer 204.

Figure 9:
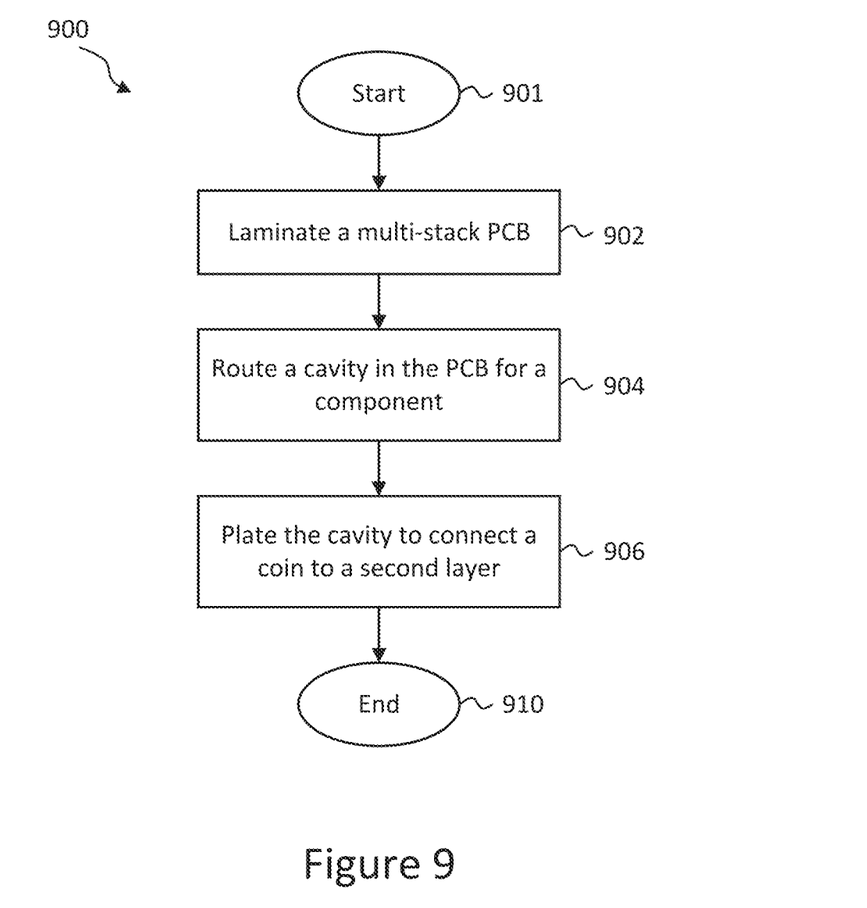
FIG. 9 is a flow diagram of a method of manufacturing a printed circuit board, according to one example embodiment of the present invention.

Referring to FIG. 9, a flow diagram of a method 900 of manufacturing a printed circuit board, such as PCB 200 of FIG. 8, is illustrated. The method starts at 901. At 902, a multi-stack printed circuit board having first, second and third conductive layers, a first non-conductive layer between the first and second conductive layers, a second non-conductive layer between the second and third conductive layers, a dielectric layer between the second conductive layer and the second non-conductive layer, a coin underneath the dielectric layer is laminated. At 904, a cavity is routed in the printed circuit board for a component. At 906 the cavity is plated to connect the coin and the second conductive layer, wherein the plating extends less than 50 um above the second conductive layer.

Overall, the method described herein enables a PCB with a copper coin such as that shown in FIG. 8 to be manufactured in fewer steps. For example, the method can eliminate the electroless copper plating step for coupling the copper coin to a grounding layer. A second routing step to reduce and standardize the length of the stub 712 can also be eliminated because the stub length can be more accurately controlled. In an example, there is only one step of routing and only one step of copper plating to form a cavity and couple the copper coin to the conductive layer. Moreover, the performance of the ground connection for the copper coin can be improved due to the shorter and/or more uniform stub length. Finally, the lack of the second routing step helps maintain more uniform dimensions for the cavity above the copper coin.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present invention, disclosure, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

We claim:
1. A printed circuit board comprising:
a first, second, and third conductive layer;
a first non-conductive layer between the first and second conductive layers;
a second non-conductive layer between the second and third conductive layers;
a dielectric layer between the second conductive layer and the second non-conductive layer;
a coin for heat dispersion located underneath the dielectric layer;
a cavity for receiving a component; and
a plating within the cavity to connect the coin with the second conductive layer, wherein the plating extends less than 50 um above the second conductive layer.
2. The printed circuit board of claim 1, further comprising a via.
3. The printed circuit board of claim 2, wherein the via has a plating to connect one or more conductive layers.
4. The printed circuit board of claim 3, wherein the plating is copper.
5. The printed circuit board of claim 1, wherein the plating extends between 0.1 um and 50 um.
6. The printed circuit board of claim 1, further comprising a fourth conductive layer and a third non-conductive layer between the third and fourth conductive layer.
7. The printed circuit board of claim 1, wherein the dielectric layer is between 1 and 40 um thick.
8. The printed circuit board of claim 1, wherein the dielectric layer eliminates a need for electroless copper plating to electrically couple the second conductive layer and the coin because the dielectric layer enables electrolytically added copper plating to grow directly across it.
9. The printed circuit board of claim 1, where one of the non-conductive layers includes a prepreg.
10. A printed circuit board comprising:
a first, second, third, fourth, fifth and sixth conductive layer;
a first laminate between the first and second conductive layers;
a first prepreg layer between the second and third conductive layers;
a dielectric layer between the first prepreg layer and the second conductive layer, the first dielectric layer having a thickness between 1 and 40 um;
a second laminate between the third and fourth conductive layers;

a second prepreg layer between the fourth and fifth conductive layers;

a third laminate between the fifth and sixth conductive layers;

a coin for heat dispersion located underneath the dielectric layer;

a cavity for receiving a component above the coin; and a plating within the cavity to connect the coin with the second conductive layer, wherein the plating extends less than 50 um above the second conductive layer and wherein the dielectric layer eliminates a need for electroless copper plating to electrically couple the second conductive layer and the coin because the dielectric layer enables electrolytically added copper plating to grow directly across it.

11. The printed circuit board of claim 10 further comprising a via wherein the via has a copper plating to connect one or more conductive layers.

12. A method of manufacturing a printed circuit board, the method comprising:

laminating a multi-stack printed circuit board having first, second and third conductive layers, a first non-conductive layer between the first and second conductive layers, a second non-conductive layer between the second and third conductive layers, a dielectric layer between the second conductive layer and the second non-conductive layer, a coin underneath the dielectric layer;

routing a cavity for receiving a component; and plating the cavity to connect the coin and the second conductive layer, wherein the plating extends less than 50 um above the second conductive layer.

13. The method of claim 12, wherein plating includes plating by electrolytically adding copper directly across the dielectric layer without first using electroless copper plating.

14. A method according to claim 13, further comprising using electroless copper plating to plate a first copper layer in the via.

15. A method according to claim 14 wherein the copper plating extends the whole length of the via to connect the first and third conductive layers.

16. A method according to claim 12, further comprising drilling a via in the printed circuit board.

17. A method according to claim 16, further comprising plating with copper over the first copper layer to form a second copper layer.

18. A method according to claim 12, mounting a component in the cavity after plating the cavity.

19. A method according to claim 12, wherein laminating includes a fourth conductive layer and a third non-conductive layer between the fourth conductive layer and the third conductive layer.

20. A method according to claim 12, wherein laminating includes using a prepreg.

\* \* \* \* \*